United States Patent
Suyama et al.

[19]

[11] Patent Number: 5,917,282

[45] Date of Patent: Jun. 29, 1999

[54] ELECTRON TUBE WITH ELECTRON LENS

[75] Inventors: Motohiro Suyama; Yoshihiko Kawai; Suenori Kimura; Ken Hirano; Norio Asakura; Tetsuya Morita, all of Hamamatsu, Japan

[73] Assignee: Hamamatsu Photonics K.K., Hamamatsu, Japan

[21] Appl. No.: 08/847,261

[22] Filed: May 1, 1997

[30] Foreign Application Priority Data

May 2, 1996 [JP] Japan ................................. 8-111656

[51] Int. Cl.$^6$ .................................................. H01J 40/04
[52] U.S. Cl. ........................ 313/544; 313/532; 250/207; 250/214 VT
[58] Field of Search .................................. 313/532, 531, 313/542, 544; 250/207, 214 VT

[56] References Cited

U.S. PATENT DOCUMENTS

| 3,705,321 | 12/1972 | Wolfgang | 313/65 AB |
|---|---|---|---|
| 5,120,949 | 6/1992 | Tomasetti | 250/207 |
| 5,146,296 | 9/1992 | Huth | 257/429 |
| 5,374,826 | 12/1994 | LaRue et al. | 250/397 |
| 5,475,227 | 12/1995 | LaRue | 250/397 |
| 5,654,536 | 8/1997 | Suyama et al. | 250/207 |

FOREIGN PATENT DOCUMENTS

| 57-46453 | 3/1982 | Japan | H01J 31/50 |
|---|---|---|---|
| 6-243795 | 9/1994 | Japan | H01J 29/45 |
| 6-318447 | 11/1994 | Japan | H01J 40/04 |
| 8-148113 | 6/1996 | Japan | H01J 43/12 |

OTHER PUBLICATIONS

Johansen et al., "Operational Characteristics of an Electron–Bombarded Silicon–Diode Photomultiplier Tube", *Nuclear Instruments and Methods in Physics Research*, 1993, pp. 295–298 (no month).

Basa et al., "Tests Results of the First Proximity Focused Hybrid Photodiode Detector Prototypes", *Nuclear Instruments and Methods in Physics Research*, 1993, pp. 93–99 (no month).

Van Geest et al., "Hybrid Phototube With Si Target", *Nuclear Instruments and Methods in Physics Research*, 1991, pp. 261–266 (no month).

Fertin et al., "Reverse Epitaxial Silicon Diode for Hybrid Photomultiplier Tube", *IEEE Trans. Nucl. Sci.*, 1968, pp. 179–189.

*Primary Examiner*—Sandra O'Shea
*Assistant Examiner*—Michael Day
*Attorney, Agent, or Firm*—Pillsbury Madison & Sutro LLP

[57] ABSTRACT

This invention relates to an electron tube which stabilizes the orbits of electrons accelerated and focused by an electron lens and has a structure for effectively suppressing noise generated due to discharge. This electron tube has, at two ends of an insulating container, a cathode electrode and an anode electrode which constitute the electron lens. Particularly, in the electron tube, one end of the cathode electrode and a photocathode are supported by a conductive member arranged at one end of the insulating container, and the cathode electrode is electrically connected to the photocathode. The cathode electrode partially extends to a stem along the inner wall of the insulating container and is tapered toward the stem so that the distal end portion of the cathode electrode is separated from the inner wall of the insulating container. Therefore, the electron tube realizes, regardless of the size of the insulating container, a structure for preventing the insulating container from being charged and suppressing discharge followed by light emission between the cathode electrode and the insulating container.

25 Claims, 8 Drawing Sheets

ELECTRON TUBE WITH ELECTRON LENS

BACKGROUND OF THE INVENTION

1. Field of the Invention

The present invention relates to a photodetector for quantitatively measuring weak light and, more particularly, to an electron tube having a photocathode and a sensing device for detecting photoelectrons emitted from the photocathode.

2. Related Background Art

Conventionally, an electron tube which causes an electron lens to accelerate and focus photoelectrons emitted from a photocathode and makes the photoelectrons incident on a sensing device, e.g., a semiconductor device to obtain a high gain, is known. A conventional electron tube is disclosed in, e.g., Japanese Patent Laid-Open No. 6-318447, U.S. Pat. Nos. 5,120,949 or 5,374,826, or G. A. Johansen, "Operational characteristics of an electron-bombarded silicon-diode photomultiplier tube", Nuclear Instruments and Methods In Physics Research A326 (1993), pp. 295–298.

Particularly, Japanese Patent Laid-Open No. 6-318447 or U.S. Pat. No. 5,374,826 discloses an electron lens constituted by a plate electrode having an opening portion for passing photoelectrons. On the other hand, U.S. Pat. No. 5,120,949 or reference by G. A. Johansen discloses an electron lens constituted by a cylindrical electrode having an opening portion for passing photoelectrons.

SUMMARY OF THE INVENTION

The present inventors have found the following problems upon examining the above prior art in detail. More specifically, the electron tube that has an electron lens with a plate electrode, has a structure in which the inner wall of the container consisting essentially of an insulating material is exposed to photoelectrons that are transmitted in the vacuum. In the electron tube having the above structure, the electron orbits are disturbed due to the valve inner wall which is charged by stray electrons, so no stable output can be obtained.

In the electron tube that has an electron lens with a cylindrical electrode, when a voltage applied to the photocathode exceeds about −7 kV, intermittent discharge occurs, resulting in a limitation in the breakdown voltage. This discharge is often followed by light emission. Light emitted by the discharge passes an arbitrary route and returns to the photocathode, thus generating a pseudo signal (noise). This pseudo signal largely degrades the SIN ratio in measuring weak light.

Particularly, in an electron tube having, as a sensing device, a semiconductor device for multiplying photoelectrons emitted from the photocathode, when the voltage to be applied to the photocathode is set to the positive side from −6 kV, discharge tends not to occur, although the gain of the semiconductor device is insufficient. This problem is inevitable because the electron tube with the semiconductor device has characteristics representing that the energy of electrons incident on the semiconductor device is converted into the gain.

In addition, even when the electron lens has a cylindrical shape, the insulating container is charged to make the electron orbits themselves unstable as long as the insulating container is directly exposed to the electron orbits.

An object of the present invention is to provide an electron tube which stabilizes the orbits of electrons accelerated and focused by an electron lens while maintaining a high gain by applying a voltage of about −15 kV to the photocathode and has a structure for effectively minimizing noise due to discharge.

According to the present invention, there is provided an electron tube comprising a container essentially consisting of an insulating material and having a first opening and a second opening opposing the first opening, a photocathode arranged on the first opening side of the insulating container to emit photoelectrons in correspondence with incident light, a stem arranged on the second opening side of the insulating container to define a distance between the photocathode and an electron incident surface for receiving the photoelectrons emitted from the photocathode, and an electron lens arranged in a space between the photocathode and the stem to accelerate the photoelectrons emitted from the photocathode and focus the photoelectrons in orbit.

The electron incident surface is included in the incident surface of a sensing device for detecting the photoelectrons emitted from the photocathode and corresponds to the electron incident surface of e.g., a semiconductor device such as an avalanche photodiode for multiplying the photoelectrons emitted from the photocathode (converting the energy of electrons into a gain). In the electron tube, the electron lens is constituted by, at least, a cathode electrode having a through hole for passing the photoelectrons emitted from the photocathode toward the electron incident surface and an anode electrode having an opening portion for passing the photoelectrons having passed through the cathode electrode toward the electron incident surface. Particularly, in the electron tube, the cathode electrode is arranged at the first opening end of the insulating container, and the anode electrode is arranged at the second opening end of the insulating container. The electron tube has a structure for sufficiently ensuring the creepage distance of the insulating container to maintain a high voltage between the cathode electrode and the anode electrode. With this structure, when the semiconductor device is mounted on the stem, sufficient gain of the semiconductor device can be obtained. The conductive member arranged at the first opening end of the insulating container supports the photocathode and the cathode electrode. The cathode electrode is electrically connected to the photocathode through the conductive member (the cathode electrode and the photocathode are set to the same potential).

The cathode electrode in the electron lens has a tapered portion extending toward the stem along the inner wall of the insulating container. To prevent the disadvantage caused by charge of the insulating container, the sectional area (the sectional area of the tapered portion defined by a plane perpendicular to the tube axis direction) of the through hole defined by the tapered portion of the cathode electrode decreases from the photocathode toward the stem such that the tapered portion is separated from the inner wall of the insulating container from the photocathode toward the stem. In other words, the area of the stem-side opening of the through hole of the cathode electrode is set to be smaller than that of the photoelectric-surface-side opening of the through hole of the cathode electrode. In addition, the distal end portion (on the stem side of the cathode electrode) of the tapered portion is bent inward in the insulating container with a predetermined curvature.

Part of the anode electrode in the electron tube according to the present invention extends toward the photocathode along the inner wall of the insulating container. The stem-side opening of the through hole of the cathode electrode and the opening portion of the anode electrode are positioned in the inner space of the insulating container, the inner space of the insulating container being defined by the first and second openings of the insulating container. More specifically, the cathode electrode projects toward the anode electrode, and the anode electrode projects toward the cathode electrode. In other words, the electron tube realizes, from the viewpoint of stabilization of an output current, a structure in which the cathode electrode is made close to the anode electrode while ensuring a sufficient creepage distance of the insulating container. With this structure, the directly exposed inner wall of the insulating container can be minimized with respect to electrons from the cathode electrode toward the anode electrode.

The electron tube according to the present invention further comprises a collimator electrode having a through hole extending from the photocathode toward the stem to pass the photoelectrons having passed through the opening portion of the anode electrode, and accommodated in the anode electrode to correct orbits of the photoelectrons incident into the through hole. The collimator electrode functions to correct the orbits of electrons emitted from the photocathode such that the electrons are vertically incident on the electron incident surface of the semiconductor device. With this structure, the electron tube maintains a high ability of discriminating the number of electrons. The sectional area (the area of the through hole defined by a plane perpendicular to the tube axis direction) of the through hole of the collimator electrode decreases from the photocathode toward the stem to improve this function.

The structural relationship between the collimator electrode and the electron incident surface will be described. The area of the stem-side opening of the through hole of the collimator electrode is smaller than that of the electron incident surface. More specifically, the effective area of the electron incident surface in which electrons corrected in their orbits by the collimator electrode are vertically incident is smaller than the area of the electron incident surface. This is because, from the viewpoint of device protection, bombardment of electrons reaching portions other than the electron incident surface must be prevented, and at the same time, unnecessary charge must be prevented.

The electron tube according to the present invention further comprises a metal shielding plate having an opening portion for holding the collimator electrode so as to fix the collimator electrode at a predetermined position in the anode electrode. This shielding plate also functions to prevent propagation of electrons to portions other than the electron incident surface. The shielding plate is directly fixed to the inner wall of the anode electrode and directly supports the collimator electrode with its opening portion. With this structure, the anode electrode and the collimator electrode are set to the same potential. The diameter of the opening portion of the shielding plate is smaller than the maximum outer diameter of the collimator electrode to directly support the collimator electrode.

To minimize the fluctuation in propagation time of the photoelectrons from the photocathode to the electron incident surface, the stem has a structure for setting the mounting surface on which, e.g., the semiconductor device is mounted in the inner space of the insulating container.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENT

Figure 1:
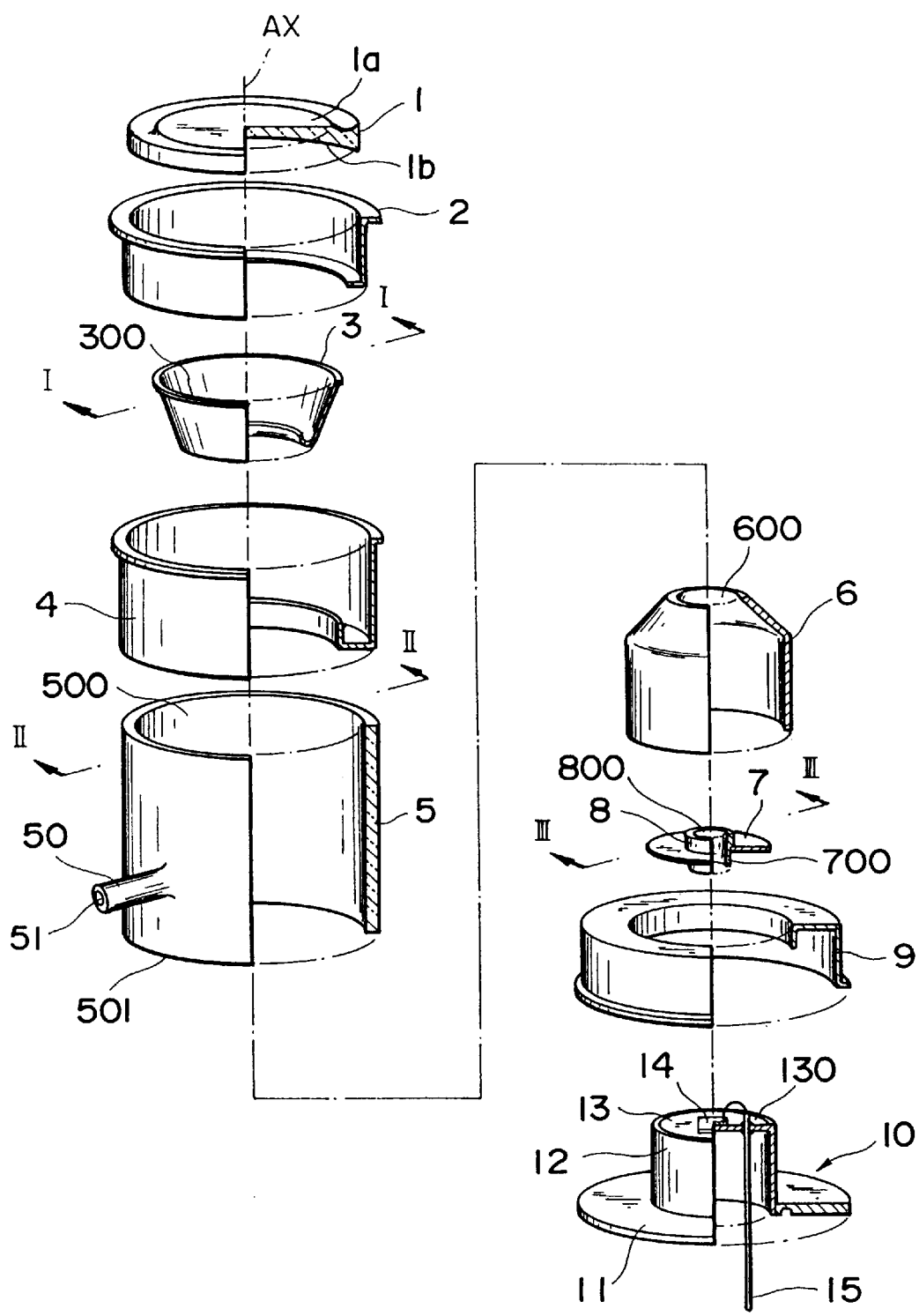
FIG. 1 is a partially cutaway perspective view showing the process of assembling an electron tube according to the present invention.

An electron tube according to an embodiment of the present invention will be described below with reference to FIGS. 1 to 10. The same reference numerals denote the same parts throughout the drawings, and a detailed description thereof will be omitted. In the following embodiment, an electron tube having, as sensing device having an electron incident surface for accepting photoelectrons emitted from a photocathode, a semiconductor device for multiplying electrons incident from the electron incident surface will be described. The electron tube having the semiconductor device is effectively used as a photodetector for quantitatively measuring very weak light with about 10 photoelectrons per event.

As one may best view in FIG. 1, an insulating container 5 is a hollow cylindrical glass valve having a total length of 24 mm and a diameter of about 25 mm. Cylindrical flanges 4 and 9, each having a height of about 3.5 mm and formed of a Kovar metal, are fused to the side of a first opening 500 and the side of a second opening 501 of the insulating container 5, respectively. An injection pipe 50 for evacuating the container 5 and injecting metal vapors for forming a photocathode is formed in the side wall of the glass valve 5.

An input surface plate 1 is constituted by a glass plate and has a first surface 1a positioned on the light incident side, and a second surface 1b positioned on an opposite side of the first surface 1a and having a concave surface facing a stem 10. This glass plate 1 is fused to a flange 2 formed of a Kovar metal. The flange 2 is welded and fixed to the flange 4 fused to the glass valve 5. A photocathode 16 (photoelectric surface) having an effective diameter of 16 mm will be formed later on the second surface 1b of the glass plate 1.

The stem 10 formed of a Kovar metal is welded and fixed to the flange 9 fused to the glass valve 5 to define the distance between the photocathode 16 and a semiconductor device 14 (electron incident surface). The stem 10 is constituted by members 11, 12, and 13 and has a convex section projecting at its central portion to the photocathode side. The semiconductor device 14 is mounted on the photoelectric-surface-side surface (electron mounting surface) of the member 13 constituting the stem 10. A lead pin 15 is connected to the semiconductor device 14 through a through hole 130 formed in the member 13.

An electron lens is arranged in the space between the photocathode 16 (glass plate 1) and the stem 10 in the container having the above structure to accelerate photoelectrons emitted from the photocathode 16 and focus the photoelectrons in orbit. This electron lens is constituted by, at least, a cathode electrode 3 consisting of stainless steel and welded and fixed to the flange 4, and an anode electrode 6 consisting of stainless steel and set at a higher potential than that of the cathode electrode 3. The cathode electrode 3 has a through hole 300 extending from the glass plate 1 toward the stem 10, and a tapered portion 33 (see FIG. 6) projecting to the stem side. The anode electrode 6 has an opening portion 600 for passing the electrons having passed through the cathode electrode 3, and a hollow cylindrical shape projecting toward the cathode electrode 3. The anode electrode 6 is welded and fixed to the flange 9 fused to the glass valve 5. Since the cathode electrode 3 is welded and fixed to the flange 4, the cathode electrode 3 is set to the same potential as that of the photocathode 16 through the flanges 4 and 2 (the flanges 2 and 4 constitute a conductive member arranged on the first opening 500 side of the glass valve 5).

A collimator electrode 8 consisting of stainless steel is arranged in the anode electrode 6 to correct the orbits of electrons such that the electrons passing through the opening portion 600 of the anode electrode 6 are vertically incident on the electron incident surface of the semiconductor device 14. The collimator electrode 8 has a through hole 800 for passing the electrons toward the semiconductor device 14. The collimator electrode 8 is fixed at a predetermined position in the anode electrode 6 by a metal shielding plate 7.

As shown in FIG. 1, the above members are attached to the first opening 500 side or second opening 501 side of the glass valve 5 along a tube axis direction AX of the glass valve 5, thus constituting a closed case with the interior being kept in a vacuum state.

Figure 2:
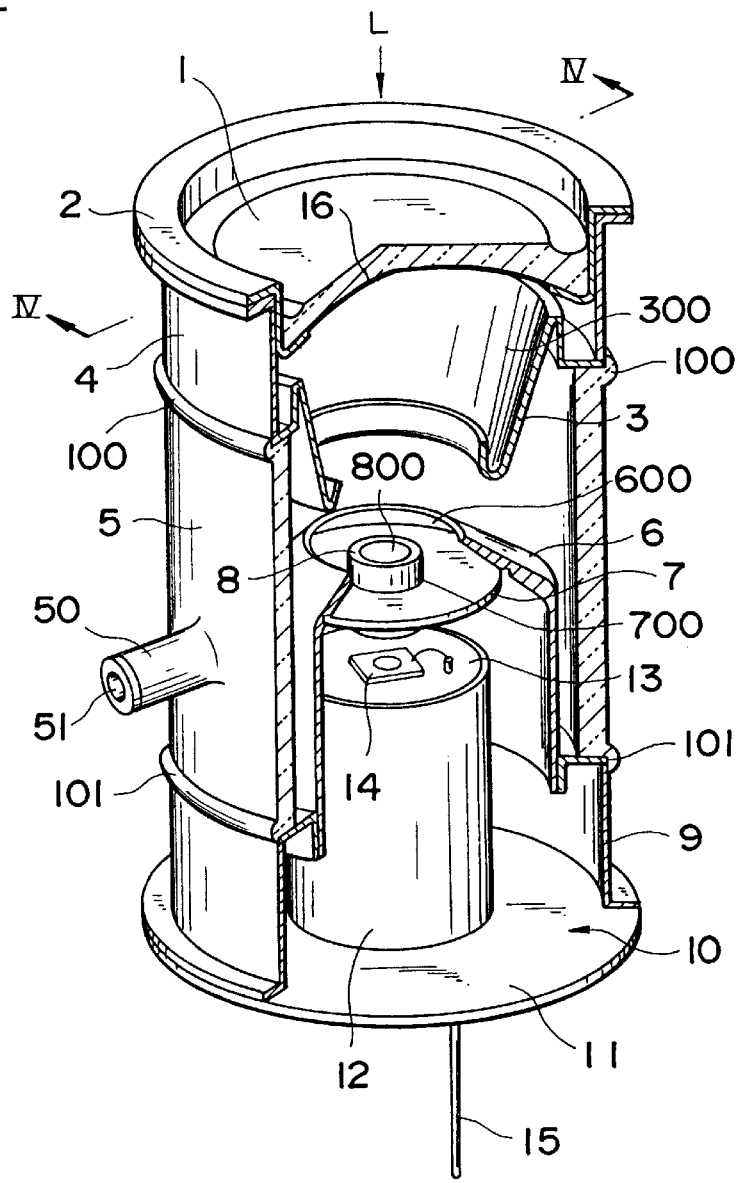
FIG. 2 is a partially cutaway perspective view showing the structure of the electron tube according to the present invention.
Figure 3:
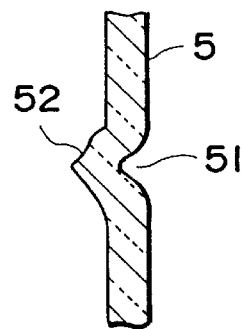
FIG. 3 is a view showing the sealing structure of an insulating container (the interior of the insulating container is in a vacuum state) in the electron tube shown in FIG. 2.
Figure 4:
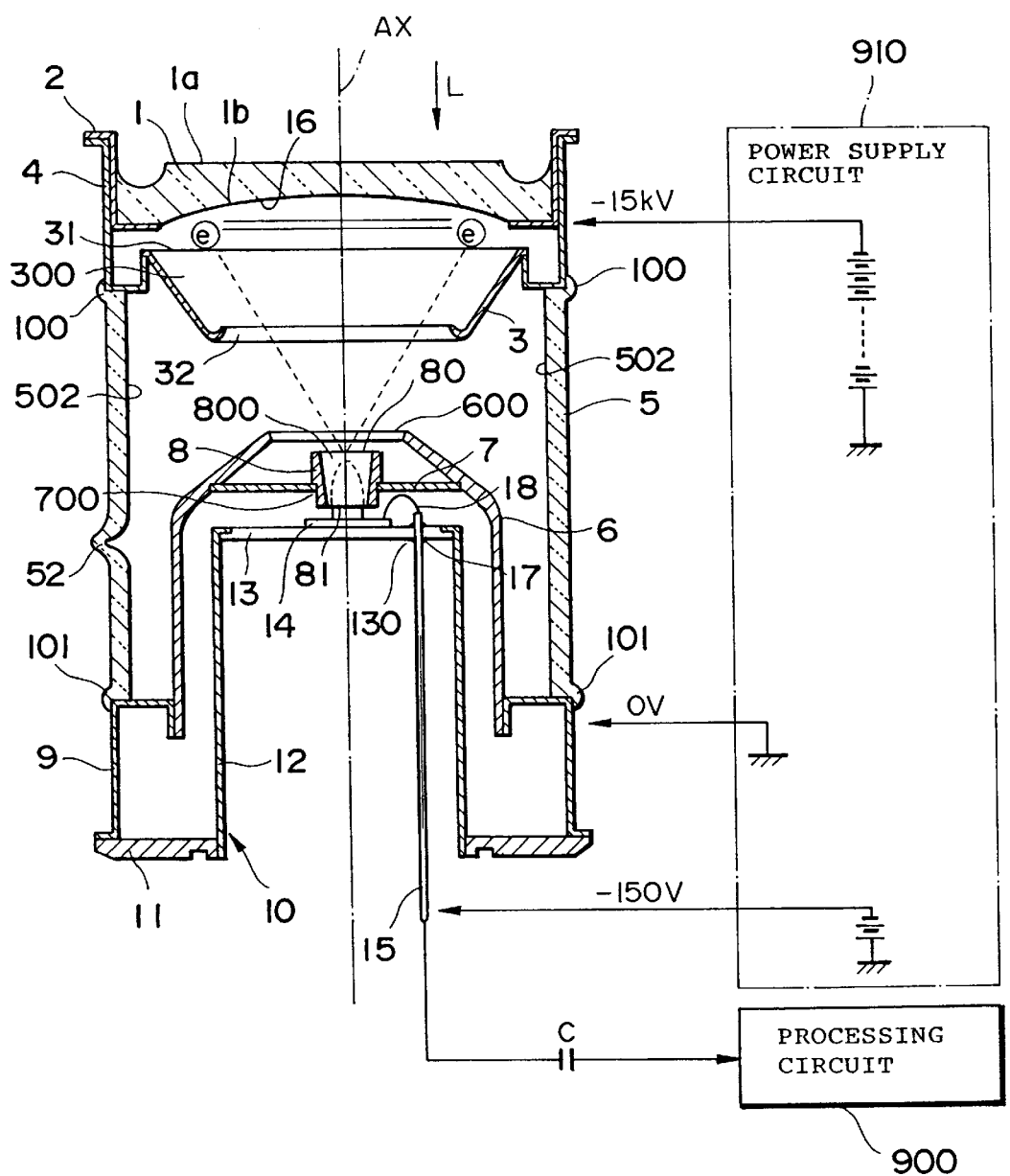
FIG. 4 is a sectional view showing the structure of the electron tube according to the present invention taken along a line IV—IV in FIG. 2 (after formation of a photocathode)

FIG. 2 is a partially cutaway perspective view of the closed case having the above structure. While the case is evacuated through a through hole 51 of the injection pipe 50, metal vapors of K (potassium), Na (sodium), and Cs (cesium) are sequentially injected through the through hole 51 to sequentially deposit these metals on the second surface 1b of the glass plate 1 and react these metals with Sb (antimony) which has been deposited on the second surface 1b in advance, thereby forming the photocathode 16 as a region having an effective diameter of about 16 mm. These metals can be selectively deposited on the second surface 1b by heating the entire case and simultaneously maintaining the glass plate 1 at a relatively low temperature. When the photocathode 16 is thus formed, the injection pipe 50 is cut to close the through hole 51, as shown in FIG. 3, thereby holding the vacuum state in the closed case (electron tube). Reference numeral 52 in FIG. 3 denotes part of the cut injection pipe 50. FIG. 4 is a sectional view showing the structure of the electron tube taken along a line IV—IV in FIG. 2 after the injection pipe 50 is cut (after the photocathode 16 is formed). As one can see in FIG. 4, reference numeral 100 denotes a fused portion between the glass valve 5 and the flange 4; and 101, a fused portion between the glass valve 5 and the flange 9.

The anode electrode 6 is a stainless steel electrode which is constituted by a hollow cylindrical portion and a conical portion with an opening portion 600 and has a shape projecting from the opening end of the glass valve 5 toward the photocathode 16 (inward from the first opening 500 of the glass valve 5). The total length of the anode electrode 6 is 18 mm. The inner diameter of the opening portion 600 formed in the anode electrode 6 is 8 mm. The anode electrode 6 having the above shape is obtained by pressing a disk plate cut from a stainless steel plate and having an opening at its center.

Figure 5:
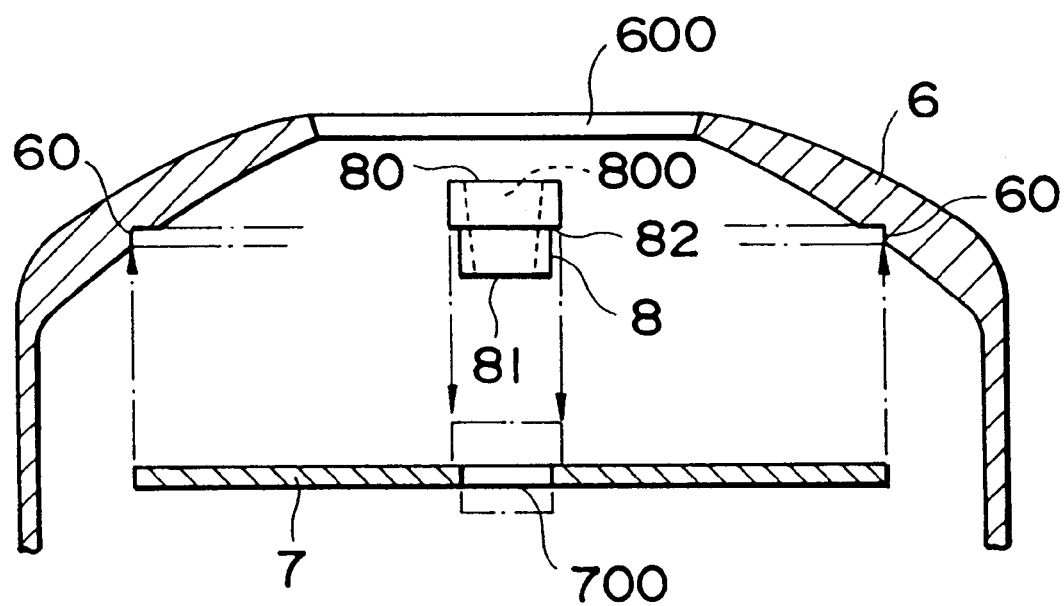
FIG. 5 is a view showing part of the sectional view shown in FIG. 4 so as to explain the attachment structure of a collimator electrode to an anode electrode.

As shown in FIG. 5, the collimator electrode 8 is fixed at a predetermined position in the anode electrode 6 through the shielding plate 7. A groove 60 (engaging groove) is formed in the inner wall of the anode electrode 6 to be perpendicular to a light incident direction L (the light incident direction L matches the tube axis direction AX of the glass valve 5) shown in FIG. 4. The shielding plate 7 its edge portion engaging with the groove 60 is welded and fixed to the anode electrode 6. With this structure, the shielding plate 7 and the anode electrode 6 are set to the same potential. The shielding plate 7 has an opening portion 700 for holding the collimator electrode 8. By welding and fixing a joint face 82 of the collimator electrode 8 to the photoelectric-surface-side surface of the shielding plate 7 while inserting the collimator electrode 8 into the opening portion 700, the collimator electrode 8 is fixed at a predetermined position in the anode electrode 6. The diameter of the opening portion 700 of the shielding plate 7 is designed to be smaller than the maximum outer diameter of the collimator electrode 8 to hole the collimator electrode 8. In the collimator electrode 8, a photoelectric-surface-side opening 80 of the through hole 800 has an area larger than that of a stem-side opening 81 of the through hole 800.

Figure 6:
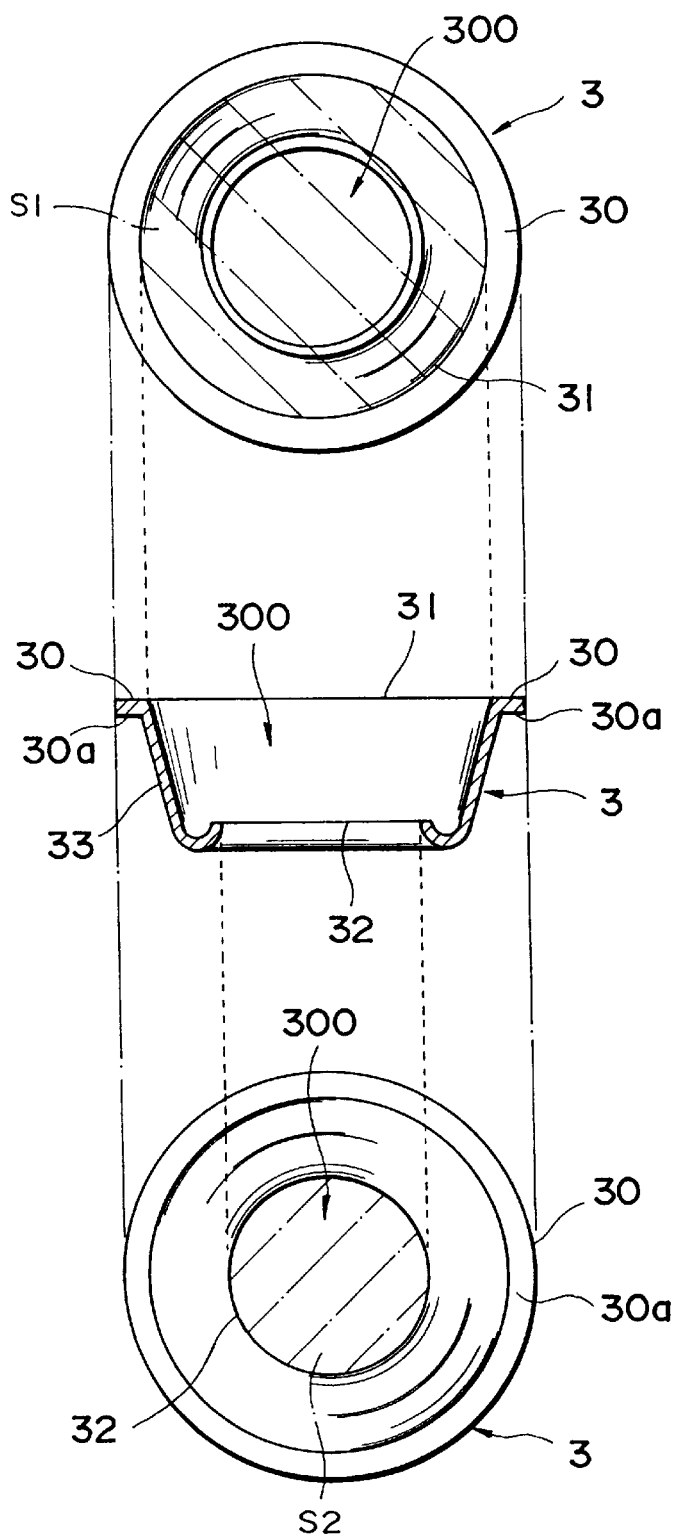
FIG. 6 shows a sectional view of the structure of a cathode electrode in the electron tube according to the present invention, a plan view of the cathode electrode viewed from the photocathode side, and a plan view of the cathode electrode viewed from a stem side, in which the sectional structure of the cathode electrode matches that taken along a line I—I in FIG. 1.

The structure of the cathode electrode 3 in the electron tube according to the present invention will be described below with reference to FIG. 6.

The cathode electrode 3 has a tapered portion 33 for defining the through hole 300. The sectional area of the through hole 300 (the area of the through hole 300 defined by a plane perpendicular to the tube axis direction AX) decreases from the photocathode 16 toward the semiconductor device 14. An edge portion 30 having an abutting surface 30a for fixing the cathode electrode 3 to the flange 4 is formed at the photoelectric-surface-side distal end portion of the cathode electrode 3. As shown in FIG. 4, the stem-side distal end portion of the cathode electrode 3 extends toward the semiconductor device 14 along an inner wall 502 of the glass valve 5. Therefore, the tapered portion 33 of the cathode electrode 3, which projects toward the stem 10, is gradually separated from the inner wall 502 of the glass valve 5 from the photocathode 16 toward the stem 10 (the stem-side distal end portion of the cathode electrode 3 is tapered toward the stem 10). In other words, the area S1 of the photoelectric-surface-side opening 31 of the through hole 300 of the cathode electrode 3 is larger than the area S2 of the stem-side opening 32 of the through hole 300 of the cathode electrode 3. The stem-side distal end portion of the tapered portion 33 is formed into a semicircular shape having a radius of curvature r of 1 mm to direct toward the tube axis of the glass valve 5.

In the cathode electrode 3, the photoelectric-surface-side opening 31 has a diameter of 22 mm, and the stem-side opening 32 has a diameter of 16 mm. The total length of the cathode electrode 3 is 6 mm. The cathode electrode 3 having the above shape is obtained by pressing a disk plate cut from a stainless steel plate and having an opening portion at its center, like the above-described anode electrode 6.

When the cathode electrode 3 constituting the electron lens has the above structure, a structure for allowing the cathode electrode 3 to shield the inner wall 502 of the glass valve 5 having insulating properties from electrons transitting through the vacuum in the closed container can be realized. As compared with the prior art, the disturbance in the electron orbits caused when the inner wall 502 of the glass valve 5 becomes charged by stray electrons is suppressed, so that a stable output can be obtained. In addition, since the inner wall 502 of the glass valve 5 can be effectively prevented from being charged, intermittent discharge (sometimes followed by light emission) due to the charge can be prevented. Therefore, the electron tube overcomes the structural disadvantage that the photocathode 16 emits electrons due to light emitted by discharge. As a result, the pseudo signal (noise) from the photocathode 16, which is generated due to discharge emission, is prevented, and the S/N ratio in measuring weak light is largely improved as compared to the conventional electron tube.

The structure of the collimator electrode 8 in the electron tube according to the present invention will be described next with reference to FIG. 7.

The collimator electrode 8 is a hollow cylindrical stainless steel electrode having the through hole 800 extending from the photocathode 16 toward the stem 10. The collimator electrode 8 is integrated with the anode electrode 6 through the shielding plate 7 (support electrode).

Normally, electrons e⁻ emitted from the photocathode 16 are accelerated and corrected in their orbits by the electron lens constituted by the cathode electrode 3 and the anode electrode 6 and incident on the electron incident surface of the semiconductor device 14. However, when the photocathode 16 is made to be close to the semiconductor device 14, and the electron lens is constituted such that the electron flow emitted from the photocathode 16 having the effective diameter of 16 mm converges to about 1.5 mm in diameter and is incident on the semiconductor device 14, the electrons e⁻ emitted from the peripheral portion of the photocathode 16 are not vertically incident on the incident surface of the semiconductor device 14. Incidence of the electrons e⁻ with a predetermined angle with respect to the direction perpendicular to the incident surface means that the electrons reaching the incident surface cross a large area (dead layer) which does not contribute to electron multiplication in the semiconductor device 14, i.e., a large energy amount is lost in the dead layer. This degrades the electron count discrimination ability of the electron tube.

The collimator electrode 8 forms an electric field for returning the photoelectrons e⁻ emitted from the peripheral portion of the photocathode 16 and obliquely incident on the semiconductor device 14 to the tube axis direction AX (the tube axis direction AX matches the light incident direction L) (FIG. 4). Consequently, the electrons e⁻ emitted from the overall area (effective diameter: 16 mm) of the photocathode 16 uniformly lose energy in the dead layer so that the electron tube can maintain a high ability of discriminating the number of electrons.

Figure 7:
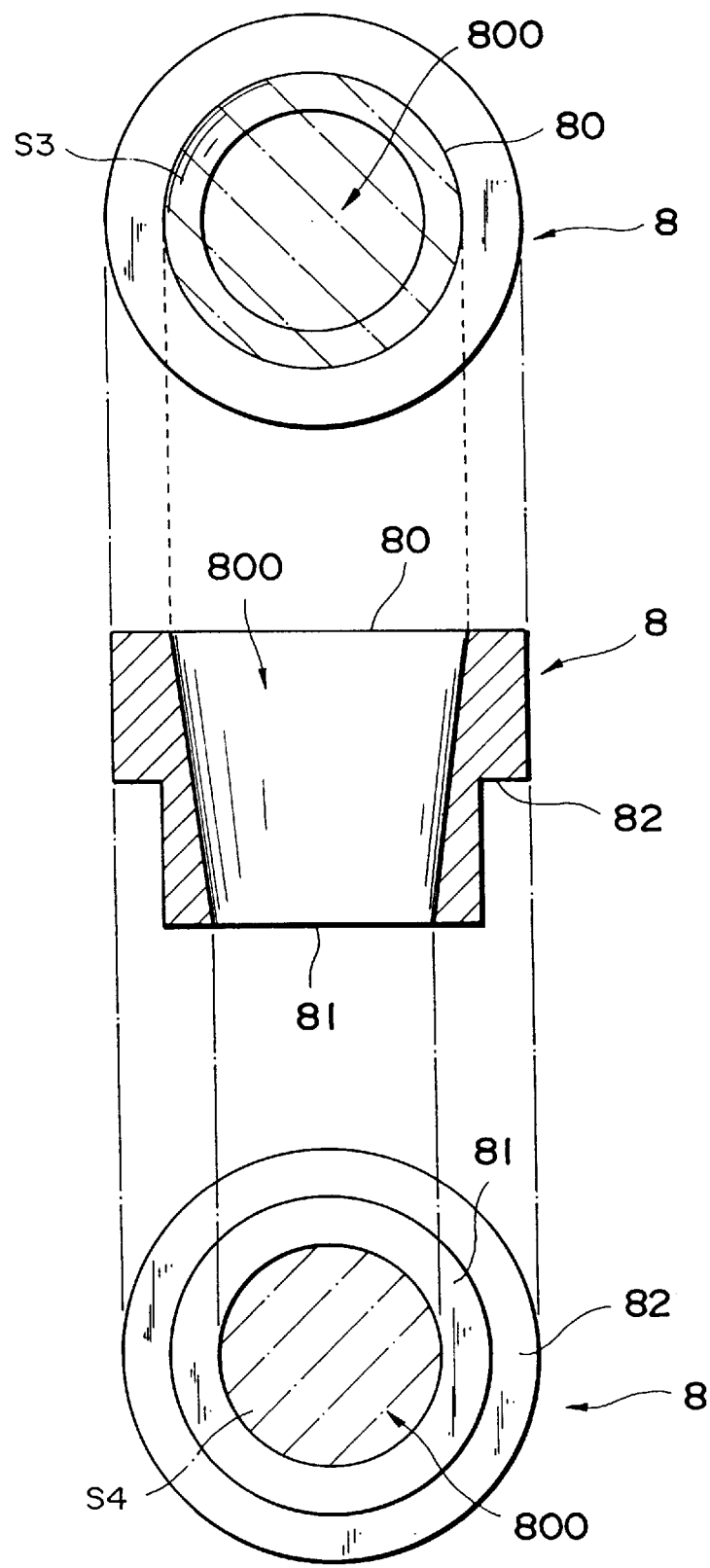
FIG. 7 shows a sectional view of the structure of the collimator electrode in the electron tube according to the present invention, a plan view of the collimator electrode viewed from the photocathode side, and a plan view of the collimator electrode viewed from a stem side, in which the sectional structure of the collimator electrode matches that taken along a line III—III in FIG. 1.

To further increase the above effect, the sectional area of the through hole 800 (the area of the through hole 800 defined by a plane perpendicular to the tube axis direction AX) of the collimator electrode 8 decreases from the photocathode 16 toward the stem 10, as shown in FIG. 7. In other words, an area S3 of the photoelectric-surface-side opening 80 of the through hole 800 of the collimator electrode 8 is larger than an area S4 of the stem-side opening 81 of the through hole 800 of the collimator electrode 8.

The structural relationship between the collimator electrode 8 and the electron incident surface of the semiconductor device 14 will be described. The area S4 of the stem-side opening 81 of the through hole 800 of the collimator electrode 8 is smaller than the area of the electron incident surface of the semiconductor device 14 (to be described later). More specifically, the area of a region for receiving electrons emitted from the photocathode is smaller than the effective area of the electron incident surface of the semiconductor device 14. With this structure, electrons accidentally emitted from portions other than the photocathode 16 are never incident on portions other than the electron incident surface of the semiconductor device 14 to degrade the semiconductor device 14 itself (degradation due to electron bombardment) or result in unnecessary charge.

When the total length of the collimator electrode 8 is 3.5 mm, the diameter of the photoelectric-surface-side opening 80 of the through hole 800 is preferably 3 mm, and the diameter of the stem-side opening 81 of the through hole 800 is preferably 2 mm (at this time, the area of the stem-side opening 81 is set to be smaller than that of the electron incident surface of the semiconductor device 14).

The stem 10 is constituted by the disk-like member 11 (stainless steel) having an opening portion at the center, the stainless steel pipe 12 with one end being welded and fixed to the opening portion of the member 11, and the disk plate 13 (Kovar metal) closing the other end of the stainless steel pipe 12. The stem 10 has a convex shape projecting from an end of the glass valve 5 having the second opening toward the photocathode 16. The semiconductor device 14 bonded on the stem 10 (on the mounting surface of the disk plate 13) is arranged on an opposite side of the photocathode 16 through the above-described collimator electrode 8. To output an output signal from the semiconductor device 14 from the closed container, the lead pin 15 insulated from the stem 10 is fixed to the disk plate 13.

The structure of the semiconductor device 14 mounted on the disk plate 13 of the stem 10 will be described below with reference to FIGS. 8 and 9.

The semiconductor device 14 is set on the disk plate 13 of the stem 10 such that an electron incident surface 148 faces the photocathode 16. An electrode layer 146 (to be described later) of the semiconductor device 14 is electrically connected to the metal lead pin 15 hermetically extending through a through hole 130 formed in the disk plate 13 by bonding the end portions of a metal wire 18 to the lead pin 15 and the electrode layer 146. A predetermined voltage is applied to the photoelectric-surface-side surface of the semiconductor device 14 from an external power supply circuit 910 through the lead pin 15 and the wire 18 so that the photoelectric-surface-side surface of the semiconductor device 14 is held at a potential of, e.g., about −150 V. The surface of the semiconductor device 14 on the disk 13 side is applied with the same voltage as that applied to the electron lens from the power supply circuit 910 through the stem 10 and held at a potential of, e.g., about 0 V. That is, the semiconductor device 14 as a whole is applied with a reverse-bias voltage.

The lead pin 15 is connected, through a capacitor C, to a processing circuit 900 for processing a detection signal (output current) output from the semiconductor device 14 (FIG. 4). An insulating member 17 is filled between the inner wall of the through hole 130 of the disk plate 13 and the lead pin 15. In the semiconductor device 14, the diameter of the electron incident surface 148 for receiving photoelectrons and effectively amplifying the photoelectrons at a predetermined multiplication factor is about 3 mm.

Figure 8:
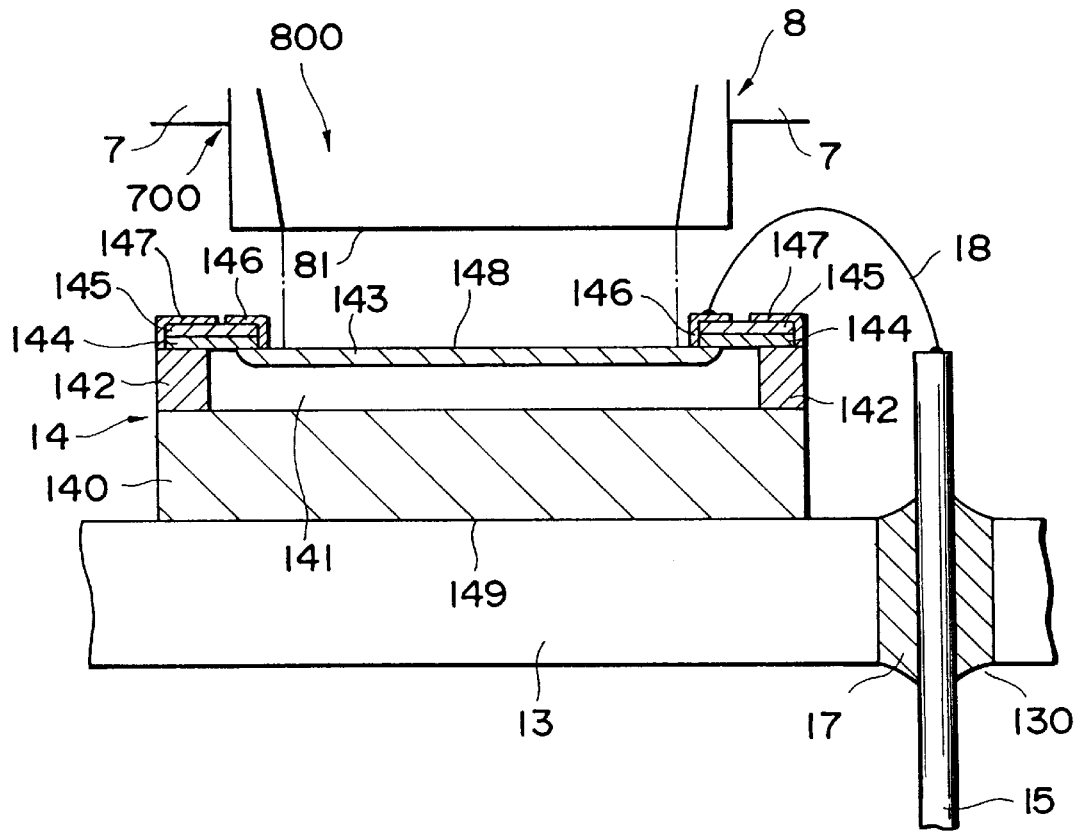
FIG. 8 is a view showing part of the sectional view shown in FIG. 4, i.e., a view showing the structure of an avalanche photodiode (semiconductor device) mounted on the stem in detail.
Figure 9:
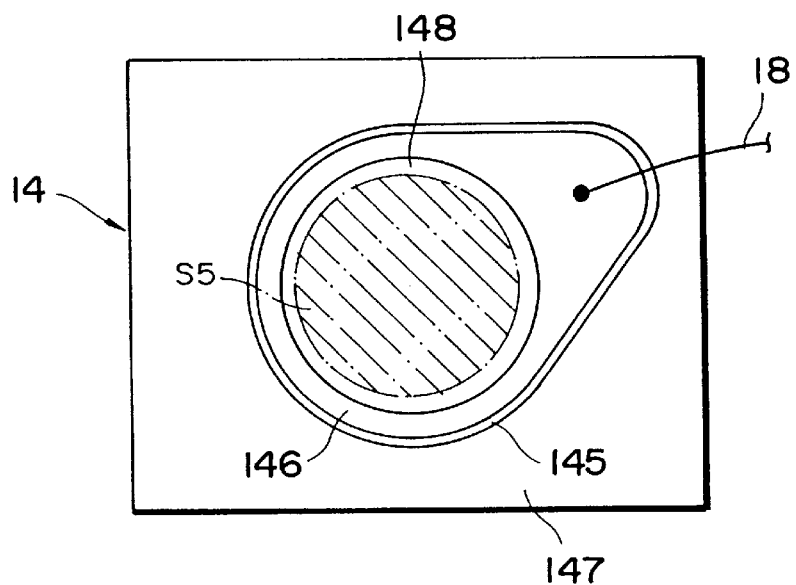
FIG. 9 is a plan view showing the semiconductor device viewed from the photocathode side so as to explain the relationship between the electron incident surface and the effective area of the semiconductor device.

In this embodiment, an avalanche photodiode (to be referred to as an APD hereinafter) is used as the semiconductor device 14, as shown in FIG. 8. The APD 14 has a substrate 140 as a heavily doped n-type silicon layer. A disk-shaped p-type carrier multiplication layer 141 is formed on the substrate 140 at the central portion. A guard ring layer 142 as a heavily doped n-type layer having the same thickness as that of the carrier multiplication layer 141 is formed on the substrate 140 outside the carrier multiplication layer 141. A breakdown voltage control layer 143 as a heavily doped p-type layer is formed on the carrier multiplication layer 141. An oxide film 144 and a nitride film 145 are formed on the surface side across the peripheral portion of the breakdown voltage control layer 143 and the guard ring layer 142. To supply an anode potential to the breakdown voltage control layer 143, the anode 146 (electrode) is formed by depositing aluminum into an annular shape. A peripheral electrode 147 rendered conductive with the guard ring layer 142 is formed around the anode 146 while forming a gap between the anode 146 and the peripheral electrode 147.

The effective surface (electron incident surface 148) of the APD corresponds to the inner portion of the anode 146 and preferably has a diameter of 3 mm. The APD 14 is die-bonded onto the disk plate 13 through a resin 149, as described above. The cathode potential of the APD 14 is applied via the stem 10.

More specifically, the substrate 140 of the APD 14 is a heavily doped monocrystalline wafer formed of n⁺-type Si. The semiconductor substrate 140 has a thickness of about 500 $\mu$m and is doped with an n-type dopant, i.e., P (phosphorus) at a concentration of about $10^{19}$ cm$^{-3}$. Note that the resistivity of the semiconductor substrate 140 is about 0.01 Ω.cm.

The carrier multiplication layer 141 is a lightly doped semiconductor layer formed by epitaxially growing p-type Si on the semiconductor substrate 140. The carrier multiplication layer 141 has a thickness of about 10 $\mu$m and is doped with a p-type dopant, i.e., B (boron) at a concentration of about $10^{14}$ to $10^{16}$ cm$^{-3}$. Note that the resistivity of the carrier multiplication layer 141 is about 1 to 100 Ω.cm. With the above dopant concentration of the carrier multiplication layer 141, when a voltage close to the breakdown voltage is applied, a depletion layer extends from the junction interface between the semiconductor substrate 140 and the carrier multiplication layer 141 and reaches the breakdown voltage control layer 143.

To epitaxially grow the carrier multiplication layer 141 while holding a satisfactory crystallinity, a thickness d of the carrier multiplication layer 141 is preferably set within the range of about 5 to 50 $\mu$m. If the thickness d is larger than about 50 $\mu$m, the dopant concentration in the direction of thickness (the direction of thickness matches the tube axis direction AX when the APD 14 is mounted on the stem 10) conspicuously becomes nonuniform. For this reason, the uniformity of the avalanche multiplication gain for electrons emitted from the photocathode 16 degrades depending on the carrier generation position. If the thickness d is smaller than about 5 $\mu$m, the depletion layer extending from the semiconductor substrate 140 becomes thin to reduce the gain of the APD 14 for electrons.

The thickness d is set to be about 10 $\mu$m due to the following reason. Where electrons emitted at an acceleration energy of about 15 keV reach the APD 14 to the maximum thickness of about 3 $\mu$m (the electrons incident on the APD 14 generate one electron-hole pair every time the electrons lose an energy of 3.6 eV), and the avalanche multiplication area has a thickness of about 3 $\mu$m, some margin is considered to minimize fluctuations in gain of the APD 14 for electrons.

The guard ring layer 142 is a heavily doped semiconductor layer formed by thermally diffusing an n-type dopant into the peripheral portion of the carrier multiplication layer 141. The thickness (about 10 $\mu$m) of the guard ring layer 142 is the same as that of the carrier multiplication layer 141. As the n-type dopant, P is doped at the same concentration as that of the substrate 140, i.e., at about $10^{19}$ cm$^{-3}$.

The breakdown voltage control layer 143 is a heavily doped semiconductor layer formed by thermally diffusing a p-type dopant in a central surface region of the carrier multiplication layer 141. The breakdown voltage control layer 143 has a thickness of about 1 $\mu$m and is doped with B as p-type dopant at the same concentration as that of the substrate 140, i.e., at about $10^{19}$ cm$^{-3}$. The circular electron incident surface 148 is exposed at the surface central portion of the breakdown voltage control layer 143 to oppose the photocathode 16. As shown in FIG. 9, the effective area of the electron incident surface 148 is limited to an area S5 smaller than the area of the electron incident surface 148 by the collimator electrode 8. More specifically, the diameter of the area where electrons can actually be incident is limited to about 2 mm although the diameter of the electron incident surface 148 capable of receiving incident electrons is about 3 mm, as described above.

The two insulating layers 144 and 145 are sequentially formed on the surface of the most peripheral portion of the breakdown voltage control layer 143 positioned at the periphery portion of the electron incident surface 148 and the entire surface of the guard ring layer 142. The insulating film 144 is an insulating thin film formed of Si oxide. The thickness of the insulating film 144 is about 200 nm. The insulating film 145 is an insulating thin film formed of Si nitride. The thickness of the insulating film 145 is about 50 nm.

The insulating film 144 is formed by oxidizing the surface region of the carrier multiplication layer 141, the guard ring layer 142, and the breakdown voltage control layer 143.

The annular ohmic electrode layer 146 is formed on the insulating film 145 to contact the surface peripheral portion of the breakdown voltage control layer 143 along the side walls of the insulating films 144 and 145. The ohmic electrode layer 146 is a metal thin film formed of Al (aluminum) and has satisfactory ohmic contact properties with the breakdown voltage control layer 143.

As described above, a predetermined voltage is applied from the external power supply circuit 910 to the ohmic electrode layer 146 through the lead pin 15 bonded to the wire 18 so that the ohmic electrode layer 146 is held at a negative potential of, e.g., −150 V. The semiconductor substrate 140 set on the stem 10 is applied with a predetermined voltage from the external power supply circuit 910 and held at, e.g., a ground (GND) potential of 0 V. With this arrangement, a depletion layer as an avalanche multiplication region is generated between the $n^+$-type semiconductor substrate 140 and the $p^+$-type breakdown voltage control layer 143, i.e., in the carrier multiplication layer 141.

From the external power supply circuit 910, a voltage of −15 kV is applied to the photocathode 16 and the cathode electrode 3, and a voltage of 0 V (ground potential) is applied to the anode electrode 6 of the electron tube having the above structure. At this time, the cathode electrode 3, the anode electrode 6, and the collimator electrode 81 form an electron lens to focus an electron flow emitted from the photocathode 16 having the effective diameter of 16 mm to a diameter of 1.5 mm smaller than the area of the stem-side opening 81 of the through hole 800 of the collimator electrode 8 so that the electron flow is incident on the electron incident surface 148 of the APD 14. A voltage of −150 V is applied to the anode 146 of the APD 14, as described above, to obtain an avalanche gain of 50. A voltage of 0 V is applied to the cathode (the stem 10 functions as the cathode) of the APD 14.

When light is incident through the input surface plate 1, electrons are emitted from the photocathode 16 into the vacuum. The emitted electrons are accelerated and focused by the electron lens, and incident on the electron incident surface 148 of the APD 14 with an energy of 15 keV. The electrons incident on the electron incident surface 148 generate one electron-hole pair every time the electrons lose an energy of 3.6 eV in the APD 14. In this first multiplication process, the electrons are multiplied to about $4 \times 10^3$ times (electron irradiation gain obtained until the incident electrons reach the avalanche multiplication region). An avalanche multiplication gain of about 50 is further obtained until these carriers pass through the avalanche multiplication region and reach the semiconductor substrate 140. Therefore, the secondary electron gain for the incident electrons is about $2 \times 10^5$ in the APD 14 as a whole.

As described above, in the electron tube according to the present invention, the multiplication factor (4,000) at the first stage is higher than that of the conventional electron tube by about three orders of magnitude. Therefore, detection with a high S/N ratio can be performed. In fact, the present inventors have confirmed that when about four electrons are emitted from the photocathode on the average upon incidence of very weak pulse light, the electron tube according to the present invention can discriminate the number of incident electrons (this number can be converted into the number of incident photons), which is beyond the discrimination ability of the conventional electron tube. Such characteristics obtained by the electron tube according to the present invention are very effective in quantitative observation of fluorescence emitted from a trace of biosubstance.

It is important that even application of a high voltage of −15 kV to the photocathode 16 does not cause discharge in the electron tube. The discharge includes not only strong discharge which destroys the photocathode 16 and the semiconductor APD 14 but also discharge which is too weak to damage these elements. Particularly, weak discharge is also often followed by light emission. Light emitted by discharge returns to the photocathode 16 through an arbitrary path, resulting in a pseudo signal (noise).

In the electron tube according to the present invention, the creepage distance (the length of the glass valve 5 along the tube axis direction AX) of the glass valve 5 is set to be 24 mm such that the creepage distance of the glass valve 5 as an insulating member for maintaining a high voltage between the cathode electrode 3 and the anode electrode 6 is maximized. With this structure, sufficient gain of the semiconductor device 14 can be obtained. In addition, the distal end portion of the cathode electrode 3 serving as a trigger of discharge, where the electric field concentrates, is separated from the inner wall 502 of the glass valve 5 which is charged to make the potential unstable (FIGS. 2 and 4). More specifically, the outer diameter of the cathode electrode 3 decreases from the photocathode 16 toward the semiconductor device 14. Furthermore, to prevent field concentration, the distal end portion of the cathode electrode 3 has a semicircular section having a radius of curvature of 1 mm (FIG. 6). With this structure, the electron tube according to the present invention realizes a structure for preventing weak discharge which is likely to occur in application of a high voltage.

In the electron tube according to the present invention, the cathode electrode 3 and the anode electrode 6 are made to be close to each other while paying attention to the time characteristic. More specifically, the cathode electrode 3 projects toward the anode electrode 6, and the anode electrode 6 projects toward the cathode electrode 3. When the electrodes 3 and 6 are made to be close to each other, a field strength for sufficiently accelerating electrons emitted from the photocathode 16 is obtained. The structure with the electrodes 3 and 6 close to each other is based on an empirical rule that the vacuum discharge between electrodes is likely to occur less than surface discharge of an insulating member. Actually, this distance does not limit the breakdown voltage. From the viewpoint of time characteristic, to reduce the photoelectron propagation distance and time from the photocathode 16 to the semiconductor device 14, the semiconductor device 14 is also made to be close to the photocathode 16 (the structure of the stem 10). With these structures, a fluctuation in propagation time from the photocathode 16 to the semiconductor device 14 is minimized, thus realizing a time characteristic of about 50 ps (picosecond).

The structure with the cathode electrode 3 and the anode electrode 6 close to each other can also eliminate the influence of the glass valve 5 consisting of an insulating material on electrons transitting in the vacuum. More specifically, the glass valve 5 may be charged to various potentials due to electrons or ions straying in the vacuum. When the inner wall 502 of the glass valve 5 is exposed to the electron orbits, the output current becomes unstable because of the influence of charge, resulting in a degradation in drift characteristics of the electron tube.

Figure 10:
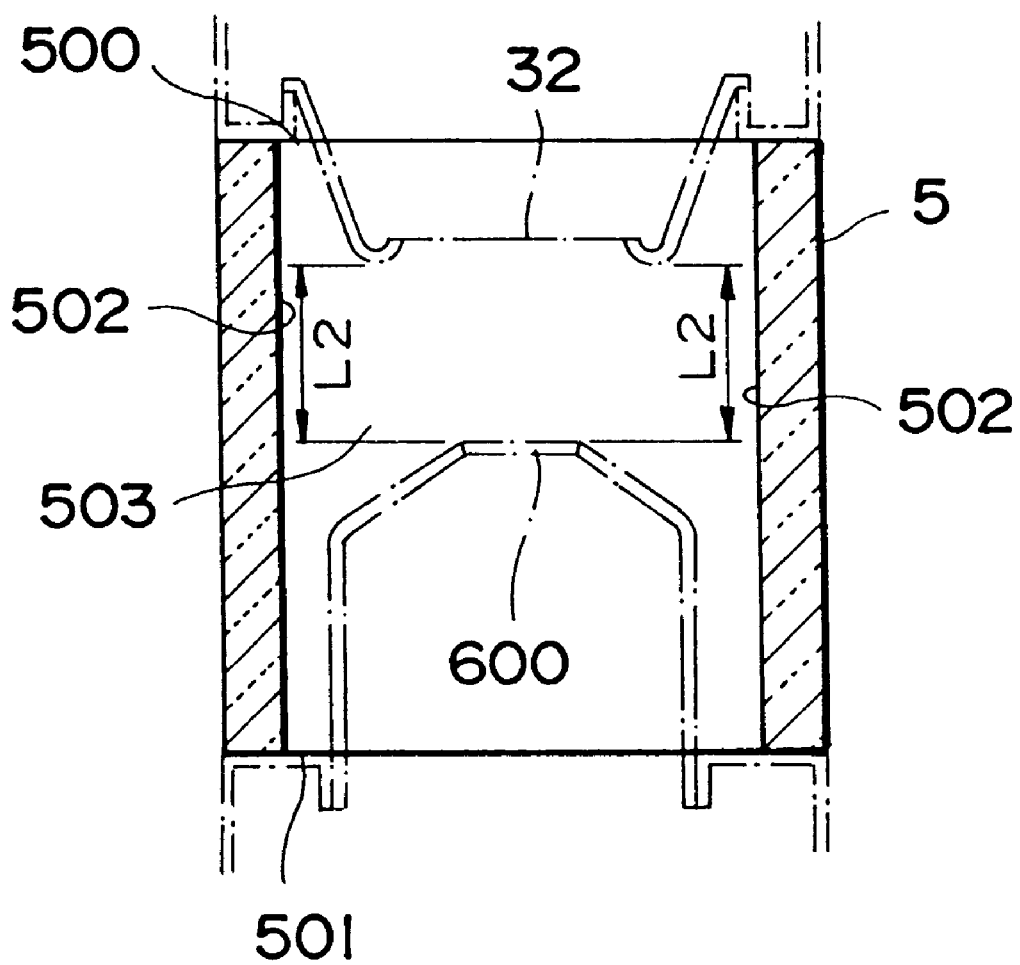
FIG. 10 is a sectional view showing the structure of a glass valve (insulating container) in the electron tube according to the present invention taken along a line II—II in FIG. 1.

The electron tube according to the present invention has the structure in which part of the cathode electrode 3 projects toward the anode electrode 6, and part of the anode electrode 6 projects toward the cathode electrode 3 to make the electrodes 3 and 6 close to each other, as described above. In other words, the stem-side opening 32 of the through hole 300 of the cathode electrode 3 and the opening portion 600 of the anode electrode 6 are positioned in an inner space 503 of the glass valve 5, which is defined by the first opening 500 and the second opening 501 of the glass valve 5, as shown in FIG. 10. With this structure, the directly exposed inner wall 502 of the glass valve 5 is minimized with respect to electrons transitting from the cathode electrode 3 to the anode electrode 6 (an area L2 shown in FIG. 10). Therefore, the output current obtained through the lead pin 15 is stabilized.

Since the collimator electrode 8 (0 V) is applied with a positive voltage with respect to the electron incident surface 148 (−150 V), ions returning from the electron incident surface 148 to the photocathode 16 can be minimized. These ions are generated from gas of molecules or atoms adsorbed on the electron incident surface 148 of the semiconductor device 14 when incident primary electrons remove electrons in the gas to make positive ions. These ions cannot return to the photocathode 16 through the collimator electrode 8 because a reverse-bias voltage for positive ions is applied between the electron incident surface 148 and the collimator electrode 8.

The characteristics representing that the ions do not return to the photocathode 16 are important. More specifically, in the electron tube, since a high voltage is applied between the photocathode 16 and the semiconductor device 14, ions returning to the photocathode 16 also have a high energy to destructively damage the photocathode 16. Therefore, if ions returning to the photocathode 16 cannot be suppressed, the service life of the photocathode 16, i.e., the service life of the electron tube is largely shortened.

As has been described above, according to the present invention, the creepage distance of the glass valve consisting of an insulating material is set to be sufficiently large, and the outer diameter of the tapered portion of the cathode electrode decreases toward the semiconductor device (the sectional area of the through hole reduces toward the stem). With this structure, the glass valve can be prevented from being charged, and intermittent discharge between the cathode electrode and the glass valve can be prevented. Therefore, a sufficiently high voltage can be stably applied to the electron tube.

The anode electrode is made close to the cathode electrode. The electrodes shield the inner wall of the glass valve from electrons such that the portion directly exposed to electrons transitting between the electrodes is minimized. With this structure, a satisfactory time characteristic can be obtained. In addition, the glass valve is less influenced by charge, so that the electron tube can realize a stable operation for a long time.

Furthermore, electrons emitted from the photocathode are also vertically incident on the semiconductor device by the function of the collimator electrode. Therefore, an electron tube having a high ability of discriminating the number of electrons can be obtained.

The stem has a structure for making the electron incident surface of the semiconductor device closer to the photocathode. With this structure, the fluctuation in propagation time of photoelectrons from the photocathode toward the electron incident surface can be minimized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No.8-111656(111656/1996) filed on May 2, 1996 is hereby incorporated by reference.

What is claimed is:

1. An electron tube, comprising:

an insulating container having a first opening and a second opening opposing said first opening;

a photocathode provided on the first opening side of said insulating container said photocathode emitting photoelectrons in correspondence with incident light;

a stem provided on the second opening side of said insulating container defining a distance between said photocathode and an electron incident surface that receives said photoelectrons from said photocathode;

a cathode electrode provided on the first opening side of said insulating container and electrically connected to said photocathode, said cathode electrode having a tapered portion which extends toward said stem along an inner wall of said insulating container to define a through hole for passing the photoelectrons from said photocathode toward said electron incident surface, said through hole being defined by said tapered portion decreasing in its sectional area from said first opening toward said second opening of said insulating container;

a conductive member provided on the first opening side of said insulating container to support said photocathode and said cathode electrode;

an anode electrode provided between said cathode electrode and said stem and having an opening portion that passes the photoelectrons that have passed through said cathode electrode toward said electron incident surface; and a collimator electrode having a through hole extending from said photocathode toward said stem that passes photoelectrons that have passed through said cathode electrode, and accommodated in said anode electrode to correct orbits of the photoelectrons passing toward said electron incident surface.

2. An electron tube according to claim 1, wherein a distal end portion of said tapered portion of said cathode electrode is bent inward in said insulating container with a predetermined curvature.

3. An electron tube according to claim 1, wherein a stem-side opening of said through hole of said cathode electrode is positioned in an inner space of said insulating container, said inner space of said insulating container being defined by said first and second openings of said insulating container.

4. An electron tube according to claim 1, wherein at least part of said anode electrode extends toward said photocathode along said inner wall of said insulating container, and wherein a stem-side opening of said through hole of said cathode electrode and said opening portion of said anode electrode are positioned in an inner space of said insulating container, said inner space of said insulating container being defined by said first and second openings of said insulating container.

5. An electron tube according to claim 1, wherein a sectional area of said through hole of said collimator electrode decreases from said photocathode toward said stem.

6. An electron tube according to claim 1, wherein an area of a stem-side opening of said through hole of said collimator electrode is smaller than that of said electron incident surface.

7. An electron tube according to claim 1, further comprising a shielding plate directly contacting said anode electrode and having an opening portion for holding said collimator electrode at a predetermined position in said anode electrode.

8. An electron tube according to claim 1, wherein a diameter of said opening portion of said shielding plate is smaller than a maximum outer diameter of said collimator electrode.

9. An electron tube according to claim 1, wherein said stem has a mounting surface on which a semiconductor device having said electron incident surface is mounted.

10. An electron tube according to claim 9, wherein said mounting surface of said stem is positioned in an inner space of said insulating container, said inner space of said insulating container being defined by said first and second openings of said insulating container.

11. An electron tube, comprising:

an insulating container having a first opening and a second opening opposing said first opening;

a photocathode provided on the first opening side of said insulating container, said photocathode emitting photoelectrons in correspondence with incident light;

a stem provided on the second opening side of said insulating container defining a distance between said photocathode and an electron incident surface that receives said photoelectrons from said photocathode;

a cathode electrode provided on the first opening side of said insulating container and electrically connected to said photocathode, said cathode electrode having a tapered portion which extends toward said stem along an inner wall of said insulating container to define a through hole for passing the photoelectrons from said photocathode toward said electron incident surface, said through hole being defined by said tapered portion decreasing in its sectional area from said first opening toward said second opening of said insulating container;

a conductive member provided on the first opening side of said insulating container to support said photocathode and said cathode electrode, said conductive member having an edge portion extending from said first opening of said insulating container toward said photocathode, one end of said cathode electrode being fixed on a distal end portion of said edge portion of said conductive member; and an anode electrode provided between said cathode electrode and said stem and having an opening portion that passes photoelectrons that have passed through said cathode electrode toward said electron incident surface.

12. An electron tube according to claim 11, further comprising a conductive member provided on the first opening side of said insulating container to support said photocathode and said cathode electrode, wherein said photocathode and said cathode electrode are electrically connected through said conductive member.

13. An electron tube according to claim 11, wherein said through hole defined by said tapered portion decreases in its sectional area from said first opening toward said second opening of said insulating container.

14. An electron tube according to claim 11, wherein a stem-side opening of said through hole of said cathode electrode is positioned in an inner space of said insulating container, said inner space of said insulating container being defined by said first and second openings of said insulating container.

15. An electron tube according to claim 11, wherein at least part of said anode electrode extends toward said photocathode along said inner wall of said insulating container, and wherein a stem-side opening of said through hole of said cathode electrode and said opening portion of said anode electrode are positioned in an inner space of said insulating container, said inner space of said insulating container being defined by said first and second openings of said insulating container.

16. An electron tube according to claim 11, wherein a sectional area of said through hole of said collimator electrode decreases from said photocathode toward said stem.

17. An electron tube according to claim 11, wherein an area of a stem-side opening of said through hole of said collimator electrode is smaller than that of said electron incident surface.

18. An electron tube according to claim 11, further comprising a shielding plate directly contacting said anode electrode and having an opening portion for holding said collimator electrode at a predetermined position in said anode electrode.

19. A tube according to claim 18, wherein a diameter of said opening portion of said shielding plate is smaller than a maximum outer diameter of said collimator electrode.

20. An electron tube according to claim 11, wherein said stem has a mounting surface on which a semiconductor device having said electron incident surface is mounted.

21. A tube according to claim 20, wherein said mounting surface of said stem is positioned in an inner space of said insulating container, said inner space of said insulating container being defined by said first and second openings of said insulating container.

22. An electron tube, comprising:

an insulating container having a first opening and a second opening opposing said first opening;

a photocathode provided on the first opening side of said insulating container, said photocathode emitting photoelectrons in correspondence with incident light;

a stem provided on the second opening side of said insulating container defining a distance between said photocathode and an electron incident surface for receiving the photoelectrons from said photocathode;

a cathode electrode provided on the first opening side of said insulating container and electrically connected to said photocathode, said cathode electrode having a tapered portion which extends toward said stem along an inner wall of said insulating container to define a through hole for passing the photoelectrons from said photocathode toward said electron incident surface, said through hole being defined by said tapered portion decreasing in its sectional area from said first opening toward said second opening of said insulating container;

a conductive member provided on the first opening side of said insulating container to support said photocathode and said cathode electrode;

an anode electrode provided between said cathode electrode and said stem and having an opening portion that passes the photoelectrons that have passed through said cathode electrode toward said electron incident surface; and a collimator electrode having a through hole extending from said photocathode toward said stem that passes photoelectrons that have passed through said cathode electrode, and accommodated in said anode electrode to correct orbits of the photoelectrons passing toward said electron incident surface, wherein a distal end portion of said tapered portion is bent inward in said insulating container with a predetermined curvature.

23. An electron tube, comprising:

an insulating container having a first opening and a second opening opposing said first opening;

a photocathode provided on the first opening side of said insulating container, said photocathode emitting photoelectrons in correspondence with incident light;

a stem provided on the second opening side of said insulating container defining a distance between said photocathode and an electron incident surface for receiving the photoelectrons from said photocathode;

a cathode electrode provided on the first opening side of said insulating container and electrically connected to said photocathode, said cathode electrode having a through hole for passing the photoelectrons from said photocathode toward said electron incident surface; and an anode electrode provided between said cathode electrode and said stem and having an opening portion that passes photoelectrons that have passed through said cathode electrode toward said electron incident surface, wherein said cathode electrode comprises:

a tapered portion extending toward said stem along an inner wall of said insulating container defining said through hole, said tapered portion being shaped such that a distance between said tapered portion and said inner wall of said insulating container increases from said first opening toward said second opening of said insulating container; and a distal end portion supported by said tapered portion and positioned in said insulating container, said distal end portion being bent inward in said insulating container with a predetermined curvature.

24. An electron tube according to claim 23, wherein said tapered portion extends straight from said photocathode toward said stem.

25. An electron tube, comprising:

an insulating container having a first opening and a second opening opposing said first opening;

a photocathode provided on the first opening side of said insulating container, said photocathode emitting photoelectrons in correspondence with incident light;

a stem provided on the second opening side of said insulating container defining a distance between said photocathode and an electron incident surface for receiving the photoelectrons from said photocathode;

a cathode electrode provided on the first opening side of said insulating container and electrically connected to said photocathode, said cathode electrode having a through hole for passing the photoelectrons from said photocathode toward said electron incident surface; and an anode electrode provided between said cathode electrode and said stem and having an opening portion that passes photoelectrons that have passed through said cathode electrode toward said electron incident surface, wherein said cathode electrode has a distal end portion, said distal end portion being bent into an interior region defined by said cathode electrode.

* * * * *